(12) United States Patent
Sekimoto

(10) Patent No.: US 6,703,905 B2
(45) Date of Patent: Mar. 9, 2004

(54) CRYSTAL OSCILLATION CIRCUIT

(75) Inventor: Yasuhiko Sekimoto, Hamakita (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/253,193

(22) Filed: Sep. 24, 2002

(65) Prior Publication Data

US 2003/0071695 A1 Apr. 17, 2003

(30) Foreign Application Priority Data

Sep. 26, 2001 (JP) ..................... P2001-294387

(51) Int. Cl.[7] ............................................. H03B 5/06
(52) U.S. Cl. .................. 331/116 F; 331/158; 331/75; 331/109; 327/333
(58) Field of Search .................... 331/116 FE, 158, 331/62, 75, 109, 160, 183, 186, 57; 327/333

(56) References Cited

U.S. PATENT DOCUMENTS

| | | | | |
|---|---|---|---|---|
| 5,113,156 A | * | 5/1992 | Mahabadi et al. | 331/109 |
| 5,486,795 A | * | 1/1996 | Spence et al. | 331/116 FE |
| 5,545,941 A | * | 8/1996 | Soneda et al. | 310/318 |
| 5,757,242 A | * | 5/1998 | Chow et al. | 331/57 |
| 5,909,152 A | * | 6/1999 | Li et al. | 331/116 FE |
| 6,181,215 B1 | * | 1/2001 | Kuttner | 331/116 FE |
| 6,278,338 B1 | * | 8/2001 | Jansson | 331/116 FE |
| 6,320,473 B1 | * | 11/2001 | Leuschner | 331/116 FE |
| 6,556,092 B1 | * | 4/2003 | Ferrant | 331/116 FE |

FOREIGN PATENT DOCUMENTS

| | | |
|---|---|---|
| JP | 58-209206 | 12/1983 |
| JP | 03-167908 | 7/1991 |
| JP | Hei 8-204450 | 8/1996 |

* cited by examiner

*Primary Examiner*—Robert Pascal
*Assistant Examiner*—Joseph Chang
(74) *Attorney, Agent, or Firm*—Pillsbury Winthrop LLP

(57) ABSTRACT

A crystal oscillation circuit using a crystal oscillator comprises an inverting amplifier, a buffer, and a voltage shift circuit. The voltage shift circuit operates in such a way that within prescribed limits by which the output of the inverting amplifier satisfies excitation conditions of the crystal oscillator and by which the oscillation output of the buffer satisfies input conditions of a following circuit, a supply voltage (Vdd) is reduced by a gate threshold voltage of an n-channel MOS transistor, and a ground potential (GND) is increased by a gate threshold voltage of a p-channel MOS transistor with respect to both the inverting amplifier and the buffer. Thus, it is possible to prevent the crystal oscillator from being damaged while suppressing the excitation level of the crystal oscillator even though the gain of the inverting amplifier is increased to be relatively high.

7 Claims, 4 Drawing Sheets

CRYSTAL OSCILLATION CIRCUIT

BACKGROUND OF THE INVENTION

1. Field of the Invention

This invention relates to crystal oscillation circuits using crystal oscillators (or quartz oscillators) and metal-oxide semiconductor transistors.

2. Description of the Related Art

FIG. 4 shows a typical example of a crystal oscillation circuit, which comprises inverters INV1 and INV2, a resistor (or resistance) Rf, a crystal oscillator X, and capacitors (or capacitance) Cg and Cd. Herein, the inverters INV1 and INV2 are each formed by CMOS (Complementary Metal-Oxide Semiconductor) transistors formed on an IC (Integrated Circuit) chip. The resistor Rf is externally arranged and is connected between terminals XIN and XOUT of the IC chip. The inverter INV1 acts as an inverting amplifier for exciting the crystal oscillator X, wherein the input thereof is connected to the terminal XIN, and the output is connected to the terminal XOUT. The inverter INV2 shapes the waveform of the output signal of the inverter INV1, wherein the input of the inverter INV2 is connected to the output of the inverter INV1.

Specifically, the inverter INV1 comprises a p-channel metal-oxide semiconductor field-effect transistor (hereinafter, referred as a PMOS transistor) P1 and an n-channel metal-oxide semiconductor field-effect transistor (hereinafter, referred to as a NMOS transistor) N1, which are connected in series between a voltage supply Vdd and the ground. These transistors P1 and N1 are coupled together in such a way that the gates thereof are both connected to the terminal XIN, and the drains thereof are both connected to the terminal XOUT. Similarly, the inverter INV2 comprises a pair of a PMOS transistor P2 and a NMOS transistor N2, which are connected in series between the voltage supply Vdd and the ground. This inverter INV2 inverts an output signal of the inverter INV1 to provide an oscillation output OSC.

The resistor Rf is arranged to set the inverter INV1 in such a way that the operating point is placed in a specific operational range providing a relatively large gain. That is, the resistor Rf is connected between the input and output of the inverter INV1 via the terminals XIN and XOUT. The crystal oscillator X is used to regulate the frequency of the oscillation output OSC (i.e., oscillation frequency). This crystal oscillator X is also connected between the input and output of the inverter INV1 via the terminals XIN and XOUT. These terminals XIN and XOUT are grounded via the capacitance Cg and Cd respectively.

The crystal oscillation circuit of FIG. 4 causes oscillation by way of a feedback loop that is formed by the inverter INV1 and the crystal oscillator X. When the oscillation frequency is shifted from the characteristic frequency of the crystal oscillator X, the crystal oscillator X may demonstrate inductive or capacitive performance in response to the frequency shifting direction, so that the oscillation frequency may be stabilized in proximity to the characteristic frequency. Thus, it is possible to produce the oscillation output OSC having the oscillation frequency that is regulated by the characteristic frequency of the crystal oscillator X. In order to demonstrate the oscillation of the crystal oscillation circuit described above, the gain of the inverter INV1 at a small-amplitude mode should be sufficiently increased to be greater than the loss of the crystal oscillator X. For this reason, the gain of the inverter INV1 is set to be sufficiently high.

Recently, electronic devices are developed in highly integrated manners and are reduced in size. Therefore, crystal oscillators should be correspondingly reduced in dimensions. As crystal oscillators are reduced in sizes, more severe restrictions should be required for excitation levels supplied to crystal oscillators. When the gain of the inverter for exciting the crystal oscillator is being increased so much in order to satisfy prescribed oscillation conditions, excitation levels should exceed prescribed limits of the crystal oscillator, which may cause unwanted damage to the crystal oscillator.

SUMMARY OF THE INVENTION

It is an object of the invention to provide a crystal oscillation circuit that would not cause damage to a crystal oscillator even though a relatively high gain is set to an inverting amplifier for exciting the crystal oscillator.

A crystal oscillation circuit for causing oscillation using a crystal oscillator comprises an inverting amplifier, a buffer, and a voltage shift circuit. The voltage shift circuit operates in such a way that within prescribed limits by which the output of the inverting amplifier satisfies excitation conditions of the crystal oscillator and by which the oscillation output of the buffer satisfies input conditions of a following circuit that follows the buffer, a supply voltage (Vdd) is reduced by a first voltage value, and a ground potential (GND) is increased by a second voltage value with respect to both the inverting amplifier and the buffer. That is, the voltage shift circuit comprises an n-channel metal-oxide semiconductor transistor whose gate threshold voltage matches the first voltage value, and a p-channel metal-oxide semiconductor transistor whose gate threshold value matches the second voltage value.

Specifically, the voltage shift circuit comprises an n-channel metal-oxide semiconductor field-effect transistor whose gate is supplied with a first bias voltage (BIAS1) for regulating upper limits of the excitation level of the crystal oscillator through a current path that is interposed in relation to the line of the supply voltage (Vdd), and a p-channel metal-oxide semiconductor field-effect transistor whose gate is supplied with a second bias voltage (BIAS2) for regulating lower limits of the excitation level of the crystal oscillator through a current path that is interposed in relation to the ground potential (GND). In addition, the voltage shift circuit can be subjected to reconfiguration in which the supply voltage is supplied to the gate of the n-channel metal-oxide semiconductor field-effect transistor, and the gate of the p-channel metal-oxide semiconductor field-effect transistor is grounded.

Thus, even though the gain of the inverting amplifier for exciting the crystal oscillator is increased to be relatively high, it is possible to prevent the crystal oscillator from being damaged while suppressing the excitation level of the crystal oscillator.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

This invention will be described in further detail by way of examples with reference to the accompanying drawings.

Figure 1:
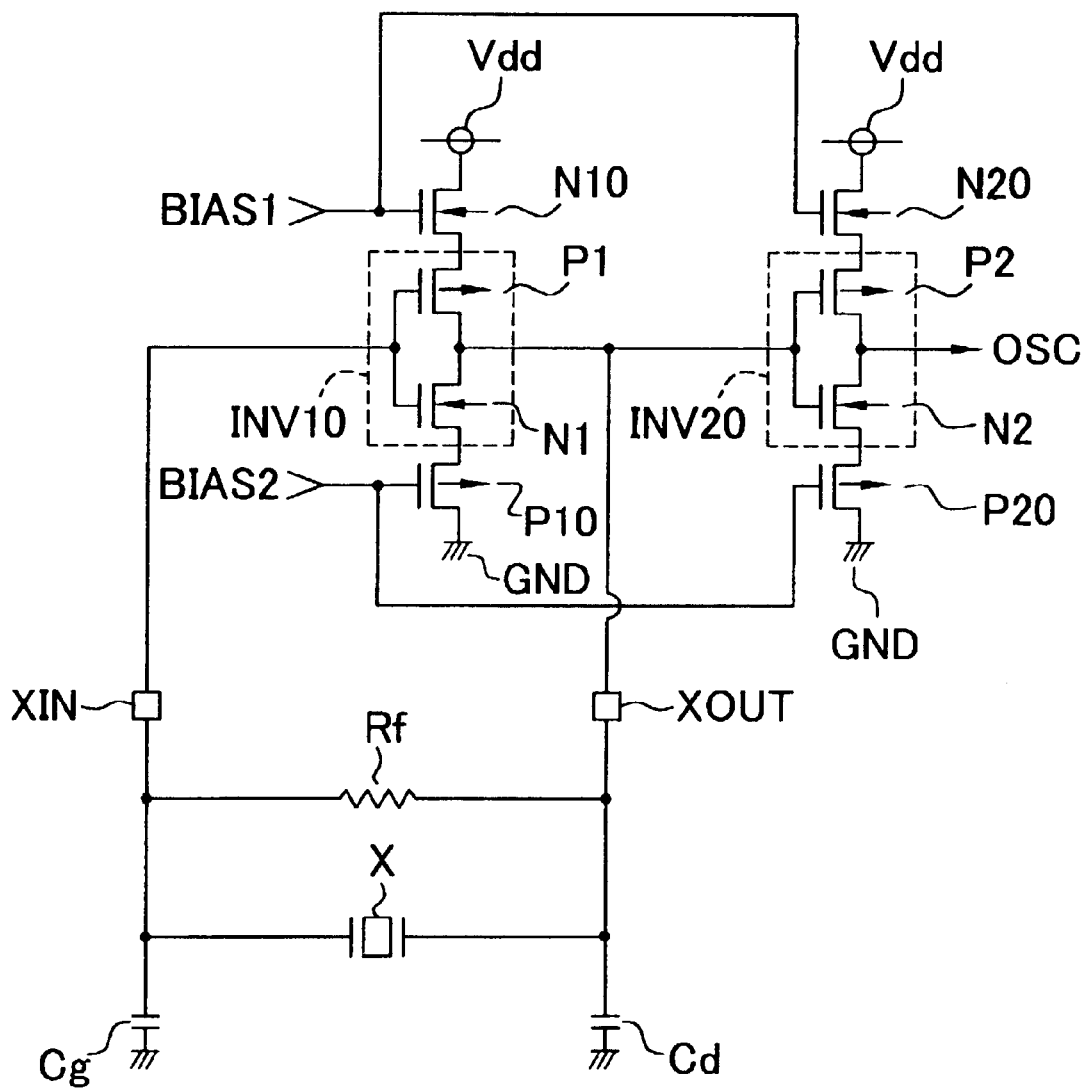
FIG. 1 is a circuit diagram showing the configuration of a crystal oscillation circuit in accordance with a preferred embodiment of the invention.
Figure 4:
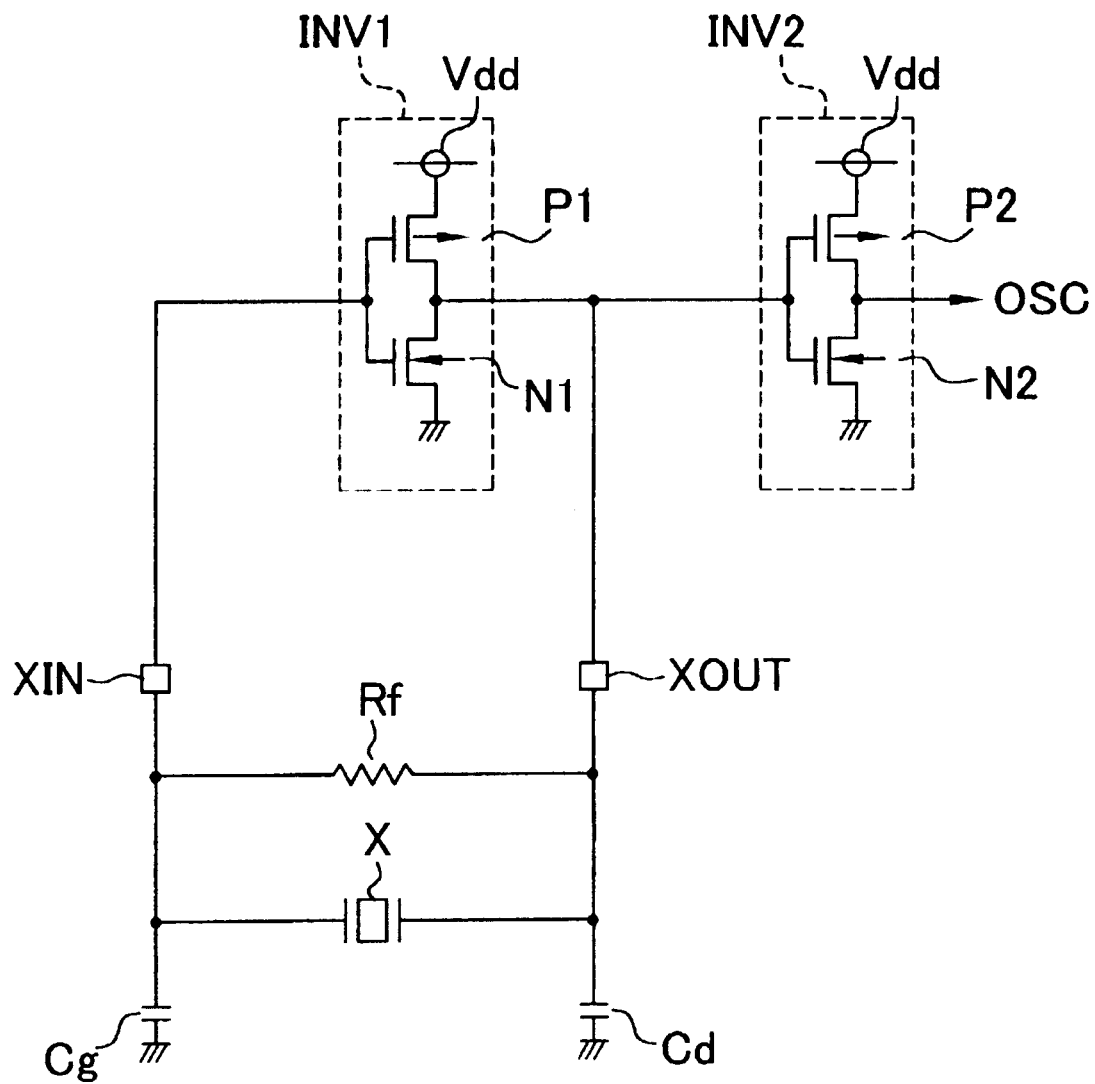
FIG. 4 is a circuit diagram showing the configuration of a typical example of a crystal oscillation circuit comprising inverters and a crystal oscillator.

FIG. 1 shows the configuration of a crystal oscillation circuit in accordance with the preferred embodiment of the invention, wherein parts identical to those shown in FIG. 4 are designated by the same reference numerals and symbols; hence, the detailed description thereof will be omitted as necessary. Similar to the foregoing crystal oscillation circuit of FIG. 4, the crystal oscillation circuit of FIG. 1 ensures oscillation by exciting the crystal oscillator X. Herein, reference numerals INV10 and INV20 designate similar configurations of the aforementioned inverters INV1 and INV2 shown in FIG. 4. Compared with the configuration of the aforementioned crystal oscillation circuit of FIG. 4, the crystal oscillation circuit of FIG. 1 is characterized by further providing a voltage shift circuit for shifting the supply voltage and ground voltage with respect to INV10 and INV20. The voltage shift circuit comprises a pair of NMOS transistors N10 and N20, and a pair of PMOS transistors P10 and P20.

Specifically, an inverting amplifier INV10 matches the inverter INV1 for exciting the crystal oscillator shown in FIG. 4, wherein it has a CMOS configuration forming a pair of the PMOS transistor P1 and the NMOS transistor N1, gates and drains of which are respectively connected together, thus realizing the input and output of the inverting amplifier INV10. The crystal oscillator X is connected between the input and output of the inverting amplifier INV10 via the terminals XIN and XOUT. In addition, a buffer INV20 matches the inverter INV2 shown in FIG. 4, wherein it has a CMOS configuration forming a pair of the PMOS transistor P2 and the NMOS transistor N2, gates and drains of which are respectively connected together, thus realizing the input and output of the buffer INV20. That is, the buffer INV20 inverts the output signal of the inverting amplifier INV10 to provide the oscillation output OSC.

A NMOS transistor N10 causes a voltage drop with respect to the 'constant' voltage of the voltage supply Vdd, wherein the current path thereof is interposed in relation to the supply line of the voltage supply Vdd for the inverting amplifier INV10. Hence, bias voltage BIAS1 defining the upper limit of the excitation level of the crystal oscillator X is supplied to the gate of the NMOS transistor N10. On the other hand, a PMOS transistor P10 causes a voltage increase with respect to the ground potential (GND), wherein the current path thereby is interposed in relation to the ground level for the inverting amplifier INV10. Hence, bias voltage BIAS2 for defining the lower limit of the excitation level of the crystal oscillator X is supplied to the gate of the PMOS transistor P10. Similarly, the current path of a NMOS transistor N20 causing a voltage drop is interposed in relation to the supply line of the voltage supply Vdd for the buffer INV20, and the current path of a PMOS transistor P20 causing a voltage increase is interposed in relation to the ground level GND for the buffer INV20. Hence, the bias voltage BIAS1 is supplied to the gate of the NMOS transistor N20, and the bias voltage BIAS2 is supplied to the gate of the PMOS transistor P20.

In the above, the NMOS transistor N10 and the PMOS transistor P10 are connected in series via the inverting amplifier INV10 between the voltage supply Vdd and the ground GND. In addition, the NMOS transistor N20 and the PMOS transistor P20 are connected in series via the buffer INV20 between the voltage supply Vdd and the ground GND. Therefore, if on-resistances of these transistors are relatively high, the inverting amplifier INV10 and the buffer INV20 are reduced in gains, which is not preferable in the aspect of the oscillation operation of the crystal oscillation circuit of FIG. 1. That is, the crystal oscillation circuit of FIG. 1 is subjected to the prescribed setup in such a way that on-resistances of these transistors are all sufficiently reduced not to deteriorate the gains of the inverting amplifier INV10 and the buffer INV20.

Next, more specific descriptions will be given with respect to connections and operations of the aforementioned transistors in the crystal oscillation circuit of FIG. 1.

The drain of the NMOS transistor N10 constructing a part of the voltage shift circuit is connected to the voltage supply Vdd, and the gate thereof is supplied with the bias voltage BIAS1. The source of the PMOS transistor P1 of the inverting amplifier INV10 is connected to the source of the NMOS transistor N10, and the gate thereof is connected to the terminal XIN. The drain of the NMOS transistor N1 and the drain of the PMOS transistor P1 of the inverting amplifier INV10 are coupled together and are connected to the terminal XOUT. In addition, the gate of the NMOS transistor N1 is coupled together with the gate of the PMOS transistor P1 and is connected to the terminal XIN. The source of the PMOS transistor P10 constructing a part of the voltage shift circuit is connected to the source of the NMOS transistor N1, and the gate thereof is supplied with the bias voltage BIAS2. In addition, the drain of the PMOS transistor P10 is grounded (GND).

Similarly, the transistors N20, P2, N2, and P20 are connected in series between the voltage supply Vdd and the ground GND. That is, the drain of the NMOS transistor N20 is connected to the voltage supply Vdd, and the gain thereof is supplied with the bias voltage BIAS1. The source of the NMOS transistor N20 is connected with the source of the PMOS transistor P2 of the buffer INV20. The gates of the PMOS transistor P2 and the NMOS transistor N2 of the buffer INV20 are coupled together and are connected to the output of the inverting amplifier INV10 as well as the terminal XOUT. The drains of these transistors P2 and N2 are coupled together as the output of the buffer INV20, which provides the oscillation output OSC. Further, the source of the NMOS transistor N2 is connected to the source of the PMOS transistor P20. Furthermore, the drain of the PMOS transistor P20 is grounded (GND), and the gate thereof is supplied with the bias voltage BIAS2.

The aforementioned NMOS transistor N10 and the PMOS transistor 10 perform voltage shift operations with respect to the inverting amplifier INV10 between the voltage supply Vdd and the ground GND. The voltage shift operations are performed within the prescribed limits satisfying the prescribed excitation conditions being sustained for the crystal oscillator X. Herein, the excitation conditions can be described as follows:

(a) The gain of the inverting amplifier INV10 is sustained so as not to become less than the prescribed value that is required to maintain the oscillation operation.

(b) The excitation level applied to the crystal oscillator X does not cause damage to the crystal oscillator X.

The aforementioned NMOS transistor N20 and the PMOS transistor P20 perform voltage shift operations with respect to the buffer INV20 between the voltage supply Vdd and the ground GND. The voltage shift operations are performed within the prescribed limits satisfying the prescribed input conditions of a following circuit (not shown) that follows the buffer INV20 to input the oscillation output OSC. Herein, the input conditions can be described as follows:

(a) The output signal level of the buffer INV20 matches the logical input threshold of the following circuit.

(b) That is, the following circuit can discriminate logical values of the ouput signal of the buffer INV20.

Next, the overall operation of the crystal oscillation circuit will be described in detail.

When the bias voltage BIAS1 is applied to the gates of the NMOS transistors N10 and N20 of the voltage shift circuit, the source voltages of these NMOS transistors are each stabilized at a voltage PVdd (=BIAS1−Vtn) at which the gate voltage is reduced by a gate threshold voltage Vtn due to the prescribed properties of the NMOS transistors. When the source voltages of the NMOS transistors N10 and N20 are each pulled down to the aforementioned voltage PVdd or less due to the operations of the inverting amplifier INV10 and the buffer INV20, the gate voltages change relative to the source voltages and exceed the gate threshold voltage Vtn. As a result, the NMOS transistors N10 and N20 are each turned on, so that they may force the source voltages thereof to be maintained at the voltage PVdd. Due to the aforementioned operations of the NMOS transistors N10 and N20, voltage shifts occur on the supply voltage Vdd, so that the inverting amplifier INV10 and the buffer INV20 are each supplied with a relatively low voltage that is substantially stabilized at the aforementioned voltage PVdd, which is lower than the "regulated" supply voltage Vdd by the gate threshold voltage Vtn.

When the bias voltage BIAS2 is applied to the gates of the PMOS transistors P10 and P20 of the voltage shift circuit, the source voltages of these PMOS transistors are each stabilized at a voltage NVss (=BIAS2+Vtp) at which the gate voltage is increased by a gate threshold voltage Vtp due to the prescribed properties of the PMOS transistors. When the source voltages of the PMOS transistors P10 and P20 are pulled up to the aforementioned voltage NVss or more due to the operations of the inverting amplifier INV10 and the buffer INV20, the gate voltages change relative to the source voltages and exceed the gate threshold voltage Vtp. As a result, the PMOS transistors P10 and P20 are each turned on, so that they may force the source voltages thereof to be maintained at the voltage NVss. Due to the aforementioned operations of the PMOS transistors P10 and P20, voltage shifts occur on the ground potential GND, so that the inverting amplifier INV10 and the buffer INV20 are each raised in ground potentials thereof to the aforementioned voltage NVss, which is higher than the ground potential GND by the gate threshold voltage Vtp.

Figure 2A:
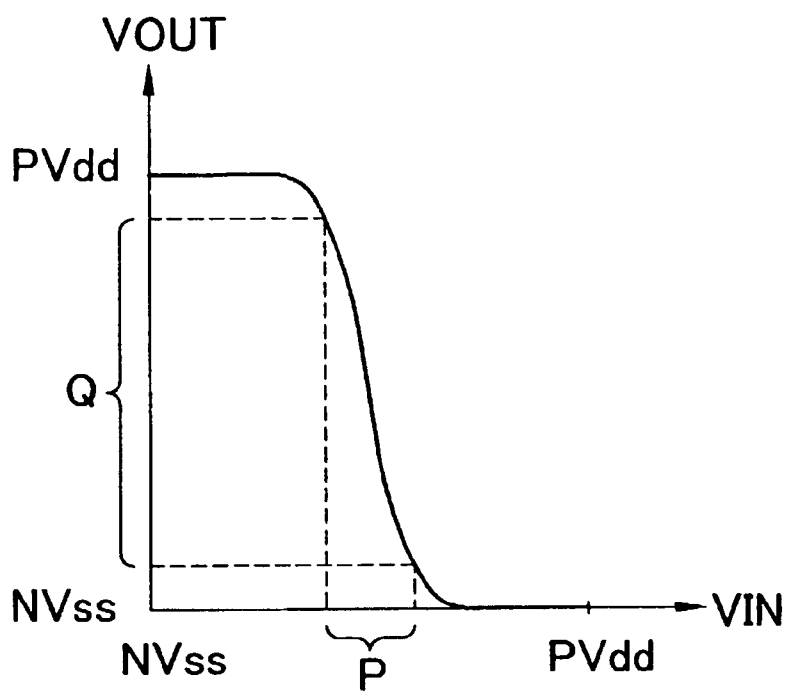
FIG. 2A is a graph showing an input/output characteristic of an inverting amplifier INV10 shown in FIG. 1.

As described above, the inverting amplifier INV10 and the buffer INV20 operate based on the 'shifted' voltages PVdd and NVss supplied thereto respectively. FIG. 2A shows an input/output characteristic (or a static characteristic) of the inverting amplifier INV10 having the CMOS configuration, wherein there exists a specific region causing rapid transition of the output voltage against variations of the input voltage. In such a transition region, it is possible to obtain a relatively large output amplitude Q compared with a relatively small input amplitude P, which yields a relatively high gain. It was described before that the gain of the inverting amplifier for exciting the crystal oscillator should be sufficiently higher than the loss of the crystal oscillator; in other words, the gain of the inverting amplifier should be increased sufficiently high. To satisfy such a requirement, the resistor Rf is externally connected between the input and output of the inverting amplifier INV10 so that the inverting amplifier INV10 will operate in the aforementioned transition region of the input/output characteristic shown in FIG. 2A.

Figure 2B:
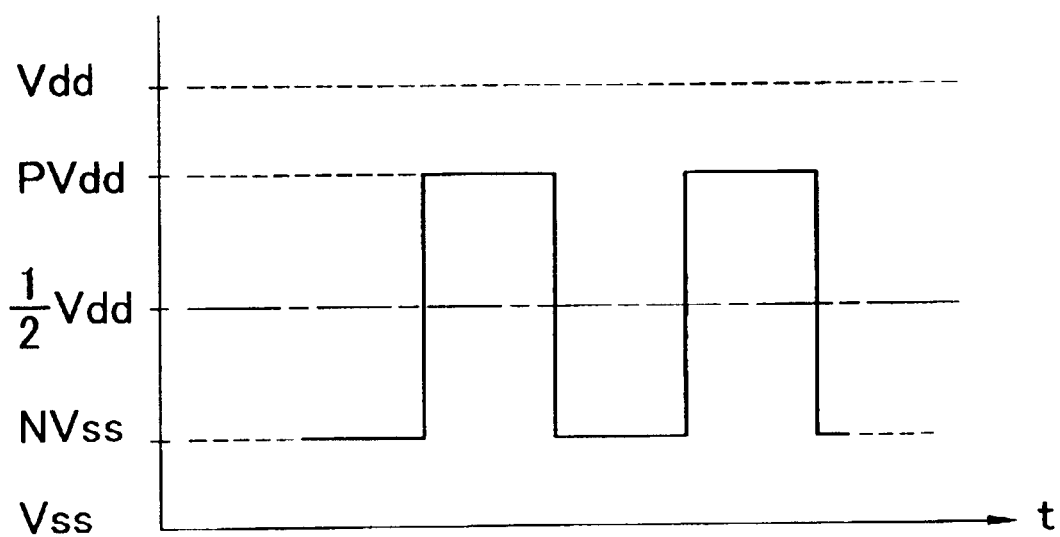
FIG. 2B is a graph showing an example of the output waveform of the inverting amplifier INV10.

FIG. 2B shows an example of the output waveform of the inverting amplifier INV10, wherein the high level of the output signal of the inverting amplifier INV10 matches the voltage PVdd supplied from the NMOS transistor N10, and the low level matches the voltage NVss supplied from the PMOS transistor P10. Therefore, the amplitude of the output signal of the inverting amplifier INV10, in other words, the excitation level that is supplied to the crystal oscillator X via the terminal XOUT, is suppressed in the range of 'PVdd−NVss'. This prevents the crystal oscillator X from being damaged in configuration and operation. Normally, the power P applied to the crystal oscillator X is expressed as the product of the current I and voltage V. For this reason, the power P can be controlled or suppressed by simply suppressing the voltage amplitude of the oscillation signal, in other words, the excitation level applied to the crystal oscillator X. The suppression of the power P of the crystal oscillator X is irrelevant to the increasing of the gain of the inverting amplifier INV10. Therefore, it is possible to reliably and simultaneously realize the increasing of the gain in an oscillation start mode and the suppression of the power P in a normal mode by shifting the supply voltage Vdd and the ground potential GND respectively.

The NMOS transistor N20 and the PMOS transistor P20 arranged for the buffer INV20 operate similar to the aforementioned NMOS transistor N10 and the PMOS transistor P10 arranged for the inverting amplifier INV10. Therefore, the buffer INV20 for inputting the output signal of the inverting amplifier INV10 is supplied with the aforementioned voltages PVdd and NVss. That is, the buffer INV20 inverts the output signal of the inverting amplifier INV10 to provide the oscillation output OSC. Herein, the oscillation output OSC has an amplitude that is similar to that of the output waveform of the inverting amplifier INV10 shown in FIG. 2B. In addition, this amplitude transits in level about the prescribed center value that substantially matches a half of the supply voltage Vdd, in other words, an intermediate value between the supply voltage Vdd and the ground potential GND. Therefore, it is possible to reliably establish the correspondence or conformity with the logical input threshold of the following circuit (not shown) that follows the buffer INV20 to receive the oscillation output OSC. Thus, even though the supply voltage and ground potential are shifted with respect to the inverting amplifier INV10 and the buffer INV20 respectively, it is possible to directly supply the oscillation output OSC of the buffer INV20 to the following circuit without intervention of a level conversion circuit or the like.

Next, modified examples of the crystal oscillation circuit shown in FIG. 1 will be described with reference to FIGS. 3A and 3B.

Figure 3A:
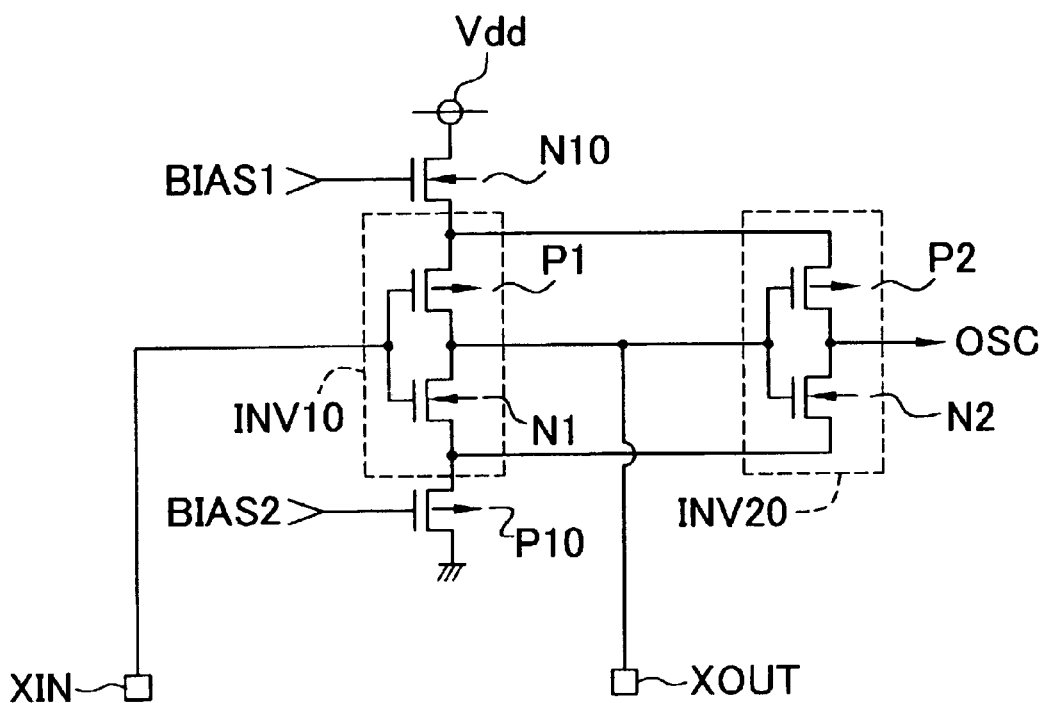
FIG. 3A is a circuit diagram showing a first modified example of the crystal oscillation circuit.

FIG. 3A shows a first modified example of the crystal oscillation circuit, wherein parts identical to those shown in FIG. 1 are designated by the same reference symbols; hence, the detailed description will be omitted as necessary. The first modified example of FIG. 3B is characterized in that the aforementioned NMOS transistor N20 and the PMOS transistor P20 are excluded from the configuration of the crystal oscillation circuit of FIG. 1. That is, the first modified example is constituted in such a way that the NMOS transistor N10 and the PMOS transistor P10 are both commonly shared by the inverting amplifier INV10 and the buffer INV20, wherein the voltage shift circuit comprises these transistors N10 and P10. Specifically, the NMOS transistor N10 is connected with the inverting amplifier INV10 and the buffer INV20 respectively, wherein the current path thereof is interposed in relation to the supply line of the voltage supply Vdd, so that the bias voltage BIAS 1 is supplied to the gate of the NMOS transistor N10. In addition, the PMOS transistor P10 is connected with the inverting amplifier INV10 and the buffer INV20 respectively, wherein the current path thereof is interposed in relation to the ground level GND, so that the bias voltage BIAS2 is supplied to the gate of the PMOS transistor P10.

In the first modified example, the NMOS transistor N10 provides the voltage PVdd, which is reduced to be lower than the supply voltage Vdd by the gate threshold voltage Vtn. Therefore, this voltage PVdd is commonly supplied to the inverting amplifier INV10 and the buffer INV20 respectively. In addition, the PMOS transistor P10 provides the voltage NVss, which is increased to be higher than the ground potential GND by the gate threshold voltage Vtp. Therefore, this voltage NVss is commonly supplied to the inverting amplifier INV10 and the buffer INV20 respectively. Hence, each of the inverting amplifier INV10 and the buffer INV20 operates based on the voltages PVdd and NVss. Thus, the inverting amplifier INV10 and the buffer INV20 cooperate together to cause oscillation in the crystal oscillation circuit of FIG. 4 similar to the foregoing circuit shown in FIG. 1.

Compared with the circuit configuration shown in FIG. 1, the first modified example of FIG. 4 can exclude the NMOS transistor N20 and the PMOS transistor P20 for the voltage shift circuit. Hence, it is possible to simplify the circuit configuration by reducing the number of circuit components required in the crystal oscillation circuit.

Figure 3B:
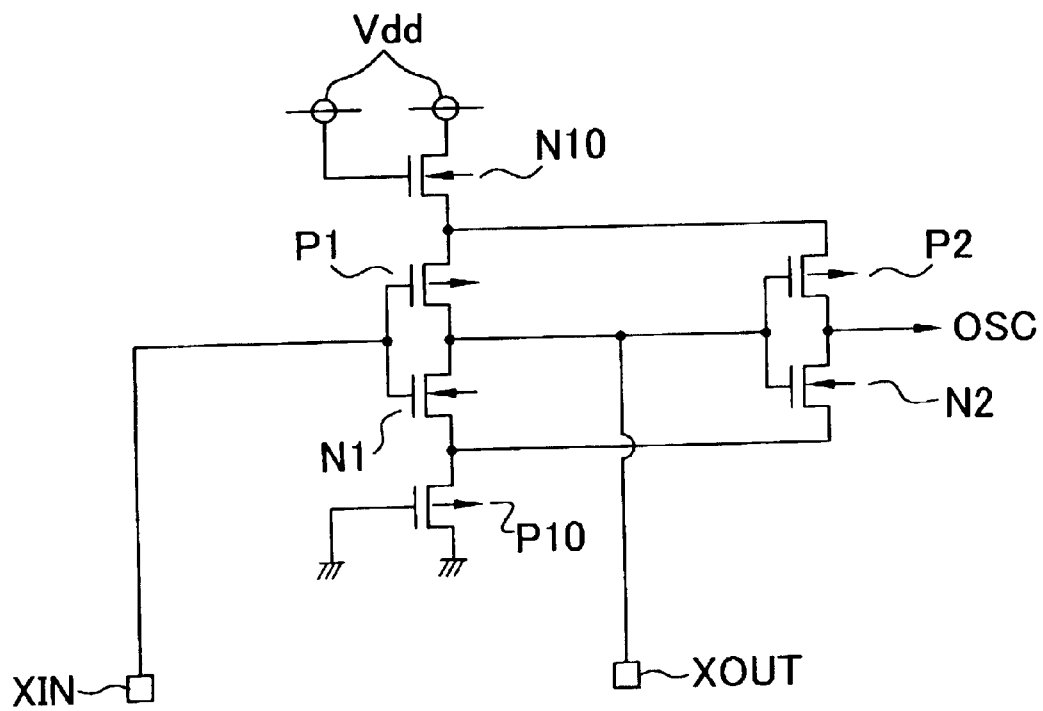
FIG. 3B is a circuit diagram showing a second modified example of the crystal oscillation circuit.

FIG. 3B shows a second modified example of the crystal oscillation circuit, the circuit configuration of which is similar to that of the first modified example of FIG. 3A, whereas in FIG. 3B, the bias voltages BIAS1 and BIAS2 are replaced with the supply voltage Vdd and the ground potential GND respectively. That is, the supply voltage Vdd is supplied to the gate of the NMOS transistor N10, and the gate of the PMOS transistor P10 is grounded at the ground potential GND.

In the second modified example, the voltage 'Vdd−Vtn', in which the supply voltage Vdd is decreased by the gate threshold voltage Vtn of the NMOS transistor N10, is commonly supplied to the inverting amplifier INV10 and the buffer INV20 respectively. In addition, the voltage 'GND+Vtp', in which the ground potential GND is increased by the gate threshold voltage Vtp of the PMOS transistor Vtp, is commonly supplied to the inverting amplifier INV10 and the buffer INV20 respectively. Therefore, each of the inverting amplifier INV10 and the buffer INV20 operates based on theses voltages. Compared with the first modified example of FIG. 3A, the second modified example of FIG. 3B does not require the bias voltages BIAS1 and BIAS2. Hence, it is unnecessary to prepare the circuitry for providing the bias voltages BIAS1 and BIAS2 for the crystal oscillation circuit.

As described heretofore, this invention is described in detail by way of the embodiment and modified examples, wherein this invention allows design choices, etc., without departing from the scope of the invention. For example, the crystal oscillation circuit of this invention basically uses the voltage shift circuit that shifts the supply voltage Vdd and the ground potential GND for the inverting amplifier INV10 and the buffer INV20 by using a pair of NMOS transistors N10 and N20, and a pair of PMOS transistors P10 and P20. Herein, the voltage shifts can be realized using the forward barrier voltage Vf of a diode through a PN junction.

The aforementioned embodiment and modified examples are each designed in such a way that the voltage shift circuit causes voltage shifts with respect to the buffer INV20 in the supply voltage and ground potential respectively. However, it is not always required to cause voltage shifts with respect to the buffer INV20. That is, the buffer INV20 can be operated directly based on the supply voltage Vdd and the ground potential GND.

Lastly, this invention has a variety of technical features and effects, which will be described below.

(1) The crystal oscillation circuit comprises an inverting amplifier for exciting a crystal oscillator, a buffer for inverting the output of the inverting amplifier to provide an oscillation output, and a voltage shift circuit that comprises MOS transistors, wherein within limits satisfying input conditions of the following circuit that follows the buffer to receive the oscillation output, the voltage shift circuit shifts down the regulated supply voltage Vdd while shifting up the ground potential GND with respect to at least the inverting amplifier. Therefore, even though the gain of the inverting amplifier is increased to be relatively high, the crystal oscillation circuit could not cause damage to the crystal oscillator, which can be reliably maintained in integrity.

(2) The voltage shift circuit comprises an n-channel MOS field-effect transistor and a p-channel MOS field-effect transistor with respect to the inverting amplifier, wherein a current path for the NMOS transistor is interposed in relation to the supply line of the power supply Vdd so that a first bias voltage is supplied to the gate of the NMOS transistor, while a current path for the PMOS transistor is interposed in relation to the ground potential GND so that a second bias voltage is supplied to the gate of the PMOS transistor. Thus, the voltage shift circuit can reliably shift down the regulated supply voltage Vdd while shifting up the ground potential with respect to the inverting amplifier.

As this invention may be embodied in several forms without departing from the spirit or essential characteristics thereof, the present embodiment and modified examples are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A crystal oscillation circuit that excites a crystal oscillator to cause oscillation at a prescribed frequency, comprising:
   an inverting amplifier for exciting the crystal oscillator;
   a buffer for inputting an output of the inverting amplifier, thus providing an oscillation output; and
   a voltage shift circuit for within prescribed limits by which the output of the inverting amplifier satisfies excitation conditions of the crystal oscillator and by which the oscillation output of the buffer satisfies input conditions of a following circuit that follows the buffer, shifting down a supply voltage (Vdd) to be dropped by a first voltage value while shifting up a ground potential (GND) to be increased by a second voltage value with respect to both the inverting amplifier and the buffer.

2. A crystal oscillation circuit according to claim 1, wherein the voltage shift circuit comprises an n-channel metal-oxide semiconductor transistor whose gate threshold voltage substantially matches the first voltage value, and a p-channel metal-oxide semiconductor transistor whose gate threshold voltage substantially matches the second voltage value.

3. A crystal oscillation circuit according to claim 1, wherein the voltage shift circuit for the inverting amplifier comprises an n-channel metal-oxide semiconductor field-effect transistor whose gate is supplied with a first bias voltage for regulating upper limits of the excitation level of the crystal oscillator through a first current path that is interposed in relation to a supply line of the supply voltage (Vdd), and a p-channel metal-oxide semiconductor field-effect transistor whose gate is supplied with a second bias voltage for regulating lower limits of the excitation level of the crystal oscillator through a second current path that is interposed in relation to the ground potential (GND).

4. A crystal oscillation circuit according to claim 1, wherein the voltage shift circuit comprises an n-channel metal-oxide semiconductor field-effect transistor whose gate is supplied with a first bias voltage through a first current path that is interposed in relation to a supply line of the supply voltage (Vdd), and a p-channel metal-oxide semiconductor field-effect transistor whose gate is supplied with a second bias voltage through a second current path that is interposed in relation to the ground potential (GND).

5. A crystal oscillation circuit according to claim 1, wherein the voltage shift circuit for both the inverting amplifier and the buffer comprises an n-channel metal-oxide semiconductor field-effect transistor whose gate is supplied with a first bias voltage for regulating upper limits of the excitation level of the crystal oscillator through a first current path that is interposed in relation to a supply line of the supply voltage (Vdd), and a p-channel metal-oxide semiconductor field-effect transistor whose gate is supplied with a second bias voltage for regulating lower limits of the excitation level of the crystal oscillator through a second current path that is interposed in relation to the ground potential (GND).

6. A crystal oscillation circuit according to claim 5, wherein the first bias voltage corresponds to the supply voltage (Vdd), and the second bias voltage corresponds to the ground potential (GND).

7. A crystal oscillation circuit according to claim 1, wherein the inverting amplifier and the buffer each have the same configuration consisting of a pair of a p-channel metal-oxide semiconductor transistor and an n-channel metal-oxide semiconductor transistor whose gates and drains are commonly connected together and which operates based on the supply voltage and the ground potential by way of the voltage shift circuit.

\* \* \* \* \*